(12) United States Patent
Shao et al.

(10) Patent No.: US 11,738,561 B2
(45) Date of Patent: Aug. 29, 2023

(54) INK CARTRIDGE VERIFICATION METHOD, SYSTEM, READABLE STORAGE MEDIUM AND DEVICE

(71) Applicant: HANGZHOU CHIPJET TECHNOLOGY CO., LTD., Hangzhou (CN)

(72) Inventors: Yuanjin Shao, Hangzhou (CN); Haining Gu, Hangzhou (CN)

(73) Assignee: HANGZHOU CHIPJET TECHNOLOGY CO., LTD., Hangzhou (CN)

( * ) Notice: Subject to any disclaimer, the term of this patent is extended or adjusted under 35 U.S.C. 154(b) by 209 days.

(21) Appl. No.: 17/290,259

(22) PCT Filed: Nov. 6, 2019

(86) PCT No.: PCT/CN2019/116034
§ 371 (c)(1),
(2) Date: Apr. 30, 2021

(87) PCT Pub. No.: WO2020/094069
PCT Pub. Date: May 14, 2020

(65) Prior Publication Data
US 2021/0379903 A1 Dec. 9, 2021

(30) Foreign Application Priority Data
Nov. 7, 2018 (CN) .......................... 201811320260.1

(51) Int. Cl.
B41J 2/175 (2006.01)
(52) U.S. Cl.
CPC ................. B41J 2/17546 (2013.01)
(58) Field of Classification Search
CPC ...... B41J 2/17546; B41J 2/1752; G01R 31/56
(Continued)

(56) References Cited

U.S. PATENT DOCUMENTS

| 6,215,557 B1 | 4/2001 | Owens | |
|---|---|---|---|
| 2007/0019046 A1* | 1/2007 | Kato | B41J 2/175 347/85 |

(Continued)

FOREIGN PATENT DOCUMENTS

| CN | 101708671 A | 5/2010 |
|---|---|---|
| CN | 101992603 A | 3/2011 |

(Continued)

OTHER PUBLICATIONS

Supplementary European Search Report of 19881087.1.
(Continued)

Primary Examiner — Matthew Luu
Assistant Examiner — Alexander D Shenderov

(57) ABSTRACT

The present disclosure provides an ink cartridge verification method, a system, a readable storage medium and a device. The method comprises: obtaining the total quantity of spray points of the ink cartridge; detecting the spray points of the ink cartridge to obtain the quantity of malfunctional spray points; when the ratio of the quantity of malfunctional spray points to the total quantity is less than or equal to a first preset ratio, determining that the ink cartridge passes verification. The malfunctional spray points are detected to obtain the ratio of the quantity of malfunctional spray points to the total quantity; when the ratio is low, it is determined that the ink cartridge passes verification, there will be no obvious influences on ink cartridge printing and the ink cartridge can be in normal use; and thus, the printing effect can be reflected after the ink cartridge is regenerated after being filled with ink.

8 Claims, 2 Drawing Sheets

(58) Field of Classification Search
USPC .............................................................. 347/6
See application file for complete search history.

(56) References Cited

U.S. PATENT DOCUMENTS

| | | | |
|---|---|---|---|
| 2007/0076067 A1* | 4/2007 | Hamano | B41J 2/17546 |
| | | | 347/86 |
| 2007/0171249 A1* | 7/2007 | Usuda | B41J 2/16532 |
| | | | 347/19 |
| 2008/0212112 A1 | 9/2008 | Araki | |
| 2009/0015623 A1* | 1/2009 | Miyamoto | B41J 29/393 |
| | | | 347/19 |
| 2017/0225454 A1 | 8/2017 | Yoshida | |

FOREIGN PATENT DOCUMENTS

| | | |
|---|---|---|
| CN | 202428831 U | 9/2012 |
| CN | 105620043 A | 6/2016 |
| CN | 206540971 U | 10/2017 |
| CN | 206644471 U | 11/2017 |
| EP | 1034935 A1 | 9/2000 |
| EP | 1200898 A1 | 5/2002 |
| JP | 2007018375 A | 1/2007 |
| JP | 2007320288 A | 12/2007 |
| JP | 2009083227 A | 4/2009 |
| JP | 2012223983 A | 11/2012 |
| JP | 2016101726 A | 6/2016 |
| JP | 2018138344 A | 9/2018 |

OTHER PUBLICATIONS

Japan Office Action of JP2021-523701.
China Office Action of 201811320260.1.
International Search Report of PCT/CN2019/116034.

* cited by examiner

INK CARTRIDGE VERIFICATION METHOD, SYSTEM, READABLE STORAGE MEDIUM AND DEVICE

CROSS-REFERENCE TO RELATED APPLICATIONS

This application is a National Stage application of International application No. PCT/CN2019/116034, filed on Nov. 6, 2019, which claims all benefits of the priority from China Patent Application No. 201811320260.1, filed on Nov. 7, 2018, in the China National Intellectual Property Administration, the content of which is hereby incorporated by reference.

TECHNICAL FIELD

The present disclosure generally relates to the technical field of an ink cartridge for a printer, and in particular, to an ink cartridge verification method, a system, a readable storage medium and a device.

BACKGROUND

In recent years, inkjet printing technology has become more mature, more inkjet printing products are available, and the use of printing consumables is rising. The ink cartridges used for printing are generally used as disposable products, but a large number of single-use waste ink cartridges are discarded, resulting in resource waste and environmental pollution. With the increased awareness and recognition of ink cartridge regeneration and the enhanced awareness of resource conservation and environmental protection by the general public, the use of ink cartridge injection to achieve ink cartridge regeneration has gradually become a trend in printer development.

However, the ink cartridge may be damaged when removed from the printer for the ink cartridge injection, and it is difficult to determine a printing effect of the ink cartridge even if the ink cartridge injection is completed.

SUMMARY

Thus, it is desired to provide an ink cartridge verification method, a system, a readable storage medium and a device to solve the problem that it is difficult to determine the printing effect of the regenerated ink cartridge after the ink cartridge injection.

An ink cartridge verification method includes the following steps:

Obtaining a total quantity of spray points of an ink cartridge;

Detecting the spray points of the ink cartridge to obtain a quantity of malfunctional spray points; and When a ratio of the quantity of malfunctional spray points to the total quantity of spray points is less than or equal to a first preset ratio, determining that the ink cartridge passes verification.

According to the above ink cartridge verification method, the total quantity of spray points of the ink cartridge is obtained and the spray points of the ink cartridge are detected to obtain the quantity of malfunctional spray points. When the ratio of the quantity of malfunctional spray points to the total quantity of spray points is less than or equal to the first preset ratio, it is determined that the ink cartridge passes verification. In the present disclosure, the malfunctional spray points of the ink cartridge are detected to calculate the ratio of the quantity of malfunctional spray points to the total quantity of spray points. When the ratio of the quantity of malfunctional spray points to the total quantity of spray points is small, it can be determined that the ink cartridge passes verification, and it will not have much impact on the printing and the ink cartridge can be used normally. As such, the ink cartridge may print effectively after injection of ink and regeneration.

In an embodiment of the present disclosure, the step of obtaining a total quantity of spray points of an ink cartridge includes the following steps:

Reading stored information of a control chip of the ink cartridge and obtaining nozzle information of the ink cartridge according to the stored information, wherein the nozzle information includes the total quantity of spray points.

In an embodiment of the present disclosure, the step of detecting the spray points of the ink cartridge includes the following steps:

For any of the spray points, applying a drive signal to the spray point, and when no drive feedback signal is detected, determining that the spray point is malfunctional.

In an embodiment of the present disclosure, the step of applying a drive signal to the spray point, and the determining that the spray point is malfunctional includes the following steps:

Applying the drive signal to a heating element, wherein the heating element is configured to heat the spray point for spraying ink; and Detecting a potential at a drive end of the heating element, and when the potential at the drive end is the same as a potential of the drive signal, determining that the spray point is malfunctional.

In an embodiment of the present disclosure, the nozzle information further includes arrangement positions of the spray points, the step of determining that the ink cartridge passes verification further including the following steps:

Obtaining a quantity of consecutive malfunctional spray points in a single row of the spray points according to the arrangement positions of the malfunctional spray points and the arrangement positions of the spray points; and when the quantity of the consecutive malfunctional spray points is less than or equal to a preset value, determining that the ink cartridge passes verification.

In an embodiment of the present disclosure, the step of determining that the ink cartridge passes verification includes the following steps:

Scanning an inkjet imprint of the spray points on test paper to obtain a print image during a print test of the ink cartridge, wherein the test paper is set below the spray points;

Comparing the print image and a preset test image to obtain a similarity between the print image and the preset test image and a blank percentage of the print image relative to the preset test image;

Obtaining a quantity of defective spray points according to the similarity and the blank percentage; and When a ratio of the quantity of defective spray points to the total quantity of spray points is less than or equal to a second preset ratio, determining that the ink cartridge passes verification.

In an embodiment of the present disclosure, the step of obtaining a quantity of defective spray points according to the similarity and the blank percentage includes the following steps:

For any of the spray points, when the similarity is less than or equal to a first threshold, or the blank percentage is greater than or equal to a second threshold, determining that the spray point is a defective spray point; and Calculating a quantity of the defective spray points of the ink cartridge.

In an embodiment of the present disclosure, the first preset ratio and the second preset ratio are adjustable.

An ink cartridge verification system includes:

A data obtaining unit, configured to obtain a total quantity of spray points of an ink cartridge;

A fault detection unit, configured to detect the spray points of the ink cartridge to obtain a quantity of malfunctional spray points; and An analysis and verification unit, configured to determine that the ink cartridge passes verification when a ratio of the quantity of malfunctional spray points to the total quantity of spray points is less than or equal to a first preset ratio.

According to the above ink cartridge verification system, the data obtaining unit can obtain the total quantity of spray points of the ink cartridge, and the fault detection unit can detect the spray points of the ink cartridge to obtain the quantity of malfunctional spray points. The analysis and verification unit can determine that the ink cartridge passes verification when the ratio of the quantity of malfunctional spray points to the total quantity of spray points is less than or equal to the first preset ratio. In the present disclosure, the malfunctional spray points of the ink cartridge are detected to calculate the ratio of the quantity of malfunctional spray points to the total quantity of spray points. When the ratio of the quantity of malfunctional spray points to the total quantity of spray points is small, it can be determined that the ink cartridge passes verification, and it will not have much impact on the printing and the ink cartridge can be used normally. As such, the ink cartridge may print effectively after injection of ink and regeneration.

In an embodiment of the present disclosure, the data obtaining unit is configured to read stored information of a control chip of the ink cartridge and obtain nozzle information of the ink cartridge according to the stored information, wherein the nozzle information includes the total quantity of spray points.

In an embodiment of the present disclosure, for any of the spray points, the fault detection unit is configured to apply a drive signal to the spray point and determine that the spray point is malfunctional when no drive feedback signal is detected.

In an embodiment of the present disclosure, the fault detection unit is configured to apply the drive signal to a heating element, wherein the heating element is configured to heat the spray point for spraying ink; and The fault detection unit is further configured to detect a potential at a drive end of the heating element and determine that the spray point is malfunctional when the potential at the drive end is the same as a potential of the drive signal.

In an embodiment of the present disclosure, the nozzle information further includes arrangement positions of the spray points, and the analysis and verification unit is configured to obtain a quantity of consecutive malfunctional spray points in a single row of the spray points according to the arrangement positions of the malfunctional spray points and the arrangement positions of the spray points, and determine that the ink cartridge passes verification when the quantity of the consecutive malfunctional spray points is less than or equal to a preset value.

In an embodiment of the present disclosure, the system further includes a test scanning unit and an image comparison unit;

The test scanning unit is configured to scan an inkjet imprint of the spray points on test paper to obtain a print image during a print test of the ink cartridge, wherein the test paper is set below the spray points;

The image comparison unit is configured to compare the print image and a preset test image to obtain a similarity between the print image and the preset test image and a blank percentage of the print image relative to the preset test image;

The fault detection unit is configured to obtain a quantity of defective spray points according to the similarity and the blank percentage; and The analysis and verification unit is configured to determine that the ink cartridge passes verification when a ratio of the quantity of defective spray points to the total quantity of spray points is less than or equal to a second preset ratio.

In an embodiment of the present disclosure, for any of the spray points, the fault detection unit is configured to determine that the spray point is a defective spray point when the similarity is less than or equal to a first threshold, or the blank percentage is greater than or equal to a second threshold; and the fault detection unit is further configured to calculate a quantity of the defective spray points of the ink cartridge.

In an embodiment of the present disclosure, the first preset ratio and the second preset ratio are adjustable.

A readable storage medium has stored an executable program thereon, wherein the executable program is executed by a processor to implement the ink cartridge verification method as described above.

The readable storage medium, through the stored executable program thereon, can achieve the following advantages: the malfunctional spray points of the ink cartridge are detected to calculate the ratio of the quantity of malfunctional spray points to the total quantity of spray points. When the ratio of the quantity of malfunctional spray points to the total quantity of spray points is small, it can be determined that the ink cartridge passes verification, and it will not have much impact on the printing and the ink cartridge can be used normally. As such, the ink cartridge may print effectively after injection of ink and regeneration.

An ink cartridge verification device includes a memory and a processor, wherein the memory stores an executable program, and the processor is configured to execute the executable program to implement the ink cartridge verification method as described above.

The ink cartridge verification device, by executing the stored executable program thereon, can achieve the following advantages: the malfunctional spray points of the ink cartridge are detected to calculate the ratio of the quantity of malfunctional spray points to the total quantity of spray points. When the ratio of the quantity of malfunctional spray points to the total quantity of spray points is small, it can be determined that the ink cartridge passes verification, and it will not have much impact on the printing and the ink cartridge can be used normally As such, the ink cartridge may print effectively after injection of ink and regeneration.

DETAILED DESCRIPTION

The present disclosure will be further described in detail below with reference to the drawings and specific embodiments, in order to better understand the objective, the technical solution and the advantage of the present disclosure. It should be understood that the specific embodiments described herein are merely illustrative and are not intended to limit the scope of the present disclosure.

It is to be noted that the terms "first/second" in the embodiments of the present invention merely distinguish similar objects and do not represent a specific ordering of the objects. It is understood that "first/second" may be interchanged in a specific order or sequence in permitting cases. It should be understood that the objects distinguished by "first/second" may be interchanged in appropriate cases, to enable embodiments of the present disclosure described herein to be implemented in an order other than those illustrated or described herein.

Figure 1:
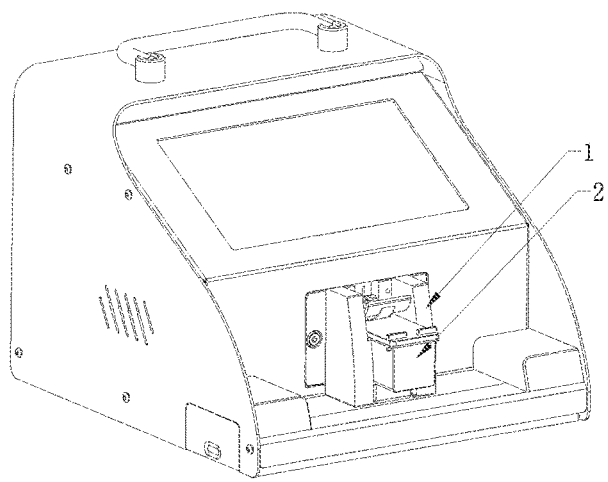
FIG. 1 is a diagram showing an application of an ink cartridge verification method according to an embodiment of the present disclosure.

An ink cartridge verification method provided by the present disclosure can be applied in an ink cartridge tester as shown in FIG. 1. A fixing bracket 1 for an ink cartridge is mounted on the ink cartridge tester, and the fixing bracket 1 is used to fix the ink cartridge 2 to be tested. The ink cartridge 2 has a nozzle facing downward, and a paper guide is disposed below the nozzle. A paper inlet is mounted on one side of the paper guide and a paper outlet is mounted on the other side. A test paper can move on the paper guide through the paper inlet and the paper outlet to facilitate printing by the nozzle of the ink cartridge. The processor inside the ink cartridge tester can be connected to the ink cartridge 2 through the fixing bracket 1, and obtain spray point information of the ink cartridge and test the spray points of the ink cartridge to verify a printing performance of the ink cartridge.

Figure 2:
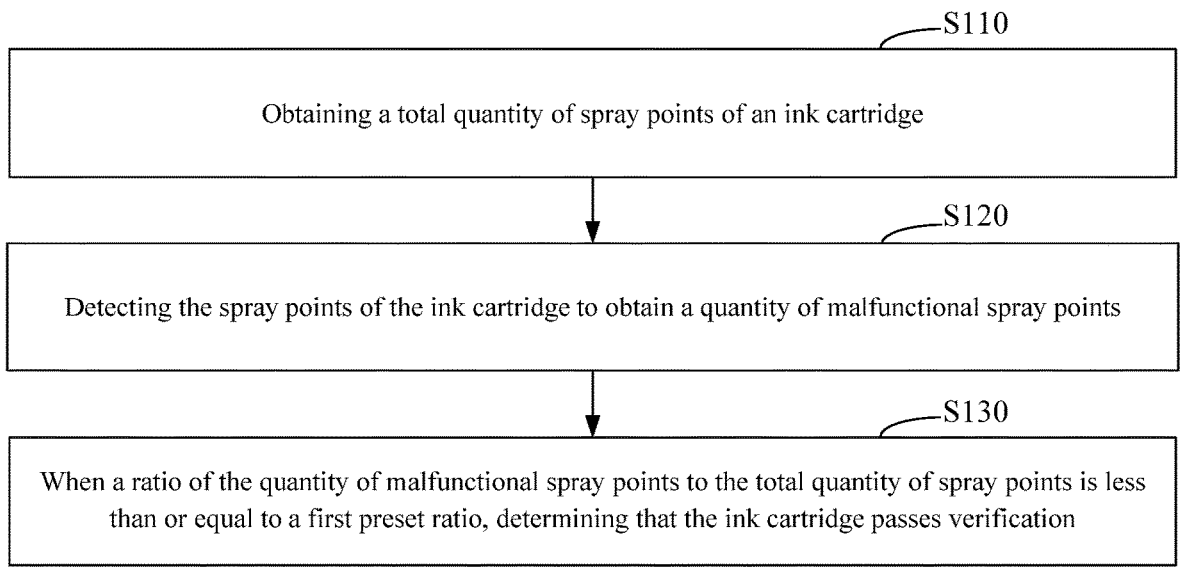
FIG. 2 is a flowchart diagram of an ink cartridge verification method according to an embodiment of the present disclosure.

Referring to FIG. 2, a flowchart diagram of an ink cartridge verification method according to an embodiment of the present disclosure is shown. The ink cartridge verification method in this embodiment includes the following steps:

At step 110, obtaining a total quantity of spray points of an ink cartridge;

In this step, the ink cartridge is mainly used to spray ink by means of a nozzle thereon, and the nozzle has a plurality of spray points arranged according to certain rules.

At step 120, detecting the spray points of the ink cartridge to obtain a quantity of malfunctional spray points;

In this step, by detecting the spray points of the ink cartridge, it can be determined that whether the nozzle is malfunctional, and the quantity of malfunctional spray points can be calculated.

At step 130, when a ratio of the quantity of malfunctional spray points to the total quantity of spray points is less than or equal to a first preset ratio, determining that the ink cartridge passes verification.

In this step, it does not affect the printing effect of the nozzle of the ink cartridge when the percentage of the malfunctional spray points out of all spray points is less than or equal to the first preset ratio, so it can be determined that the ink cartridge passes verification.

In the present embodiment, the total quantity of spray points of the ink cartridge is obtained, and the spray points of the ink cartridge are detected to obtain the quantity of malfunctional spray points. When the ratio of the quantity of malfunctional spray points to the total quantity of spray points is less than or equal to the first preset ratio, it is determined that the ink cartridge passes verification. In the present disclosure, the malfunctional spray points of the ink cartridge are detected to calculate the ratio of the quantity of malfunctional spray points to the total quantity of spray points. When the ratio of the quantity of malfunctional spray points to the total quantity of spray points is small, it can be determined that the ink cartridge passes verification, and it will not have much impact on the printing and the ink cartridge can be used normally. As such, the ink cartridge may print effectively after injection of ink and regeneration.

It should be noted that during a verification process of the ink cartridge, important parameters of the verification process can be displayed on a display screen of the ink cartridge tester, such as the total quantity of spray points, the quantity of malfunctional spray points, and a verification result, which are used for the operator to understand specific information of the ink cartridge.

In an embodiment, the step of obtaining a total quantity of spray points of an ink cartridge includes the following steps:

Reading stored information of a control chip of the ink cartridge and obtaining nozzle information of the ink cartridge according to the stored information, wherein the nozzle information includes the total quantity of spray points.

In the present embodiment, parameter information of the ink cartridge is stored in the control chip of the ink cartridge. By reading the stored information of the control chip, the parameters of the ink cartridge can be obtained, and the nozzle information of the ink cartridge can be extracted from the parameters. The nozzle has a plurality of spray points, and the total quantity of spray points can be obtained through the nozzle information, and then the spray points of the ink cartridge can be detected.

Further, a data table that associates the model data of the ink cartridge with the nozzle information can be saved in advance. When the stored information of the control chip is read, the model data of the ink cartridge can be obtained. An ink cartridge model is found in the data table according to the model data of the ink cartridge, and corresponding nozzle details can be obtained.

In an embodiment, the step of detecting the spray points of the ink cartridge includes the following steps:

For any of the spray points, applying a drive signal to the spray point, and when no drive feedback signal is detected, determining that the spray point is malfunctional.

In the present embodiment, the nozzle has a plurality of spray points. For any spray point, a drive signal is applied to the spray point. The drive feedback signal is detected to determine whether the spray point is malfunctional, and when there is no drive feedback signal, it means that the drive control of the spray point is malfunctional. When there is a drive feedback signal, it means that the spray point can spray ink normally and the performance status of the spray point is confirmed.

In an embodiment, the step of applying a drive signal to the spray point, and the determining that the spray point is malfunctional includes the following steps:

Applying the drive signal to a heating element, wherein the heating element is configured to heat the spray point for spraying ink;

Detecting a potential at a drive end of the heating element, and when the potential at the drive end is the same as a potential of the drive signal, determining that the spray point is malfunctional.

In the present embodiment, the heating elements and the spray points are in one to one correspondence, and the heating element is used to control the spray point to spray ink. After one spray point is selected, a drive signal is applied on the heating element of the spray point. In a case of a normal connection of the heating element, the heating element can be conducted by the drive signal. The potential of the drive end of the heating element will change at this time and differs from the potential of the drive signal. When the heating element is damaged or has connection failure, the potential of the drive end of the heating element is the same as that of the driving signal, so that the performance of the spray point can be tested.

It should be noted that the drive feedback signal can include a potential of the drive end different from the potential of the drive signal.

Specifically, the drive end of the heating element of the spray point can connect to the power supply terminal through a pull-up resistor, and the potential of the drive end of the heating element will be pulled down when the spray point is selected and the heating element is conducted. When the heating element is defective, the potential of the drive end will not be pulled down, and it can be determined whether the spray point is normal based on the potential state of the drive end. As the nozzle has a plurality of spray points, one spray point can be selected each time to detect the drive end of the heating element, and all spray points are detected in accordance with the order of arrangement of the spray points. In addition, the role of the heating element is exciting the ink cartridge to spray ink, and the heating element can be a variety of different components that control heat generation through electrical signals, such as thermistors.

In an embodiment, the nozzle information further includes arrangement positions of the spray points, the step of determining that the ink cartridge passes verification further including the following steps:

Obtaining a quantity of consecutive malfunctional spray points in a single row of the spray points according to the arrangement positions of the malfunctional spray points and the arrangement positions of the spray points; and when the quantity of the consecutive malfunctional spray points is less than or equal to a preset value, determining that the ink cartridge passes verification.

In the present embodiment, the spray points are arranged in accordance with preset positions, generally divided into several rows of spray points, and each row contains a plurality of spray points. When multiple consecutive spray points in a single row are malfunctional, a larger area of blank will appear when printing, seriously affecting the printing effect. Therefore, the quantity of consecutive malfunctional spray points in a single row of the spray points can be determined by the arrangement positions of the malfunctional spray points and the arrangement positions of the spray points. Only when the quantity of consecutive malfunctional spray points in a single row of the spray points is small, the ink cartridge can pass verification and be normally used.

In an embodiment, the step of determining that the ink cartridge passes verification includes the following steps:

Scanning an inkjet imprint of the spray points on test paper to obtain a print image during a print test of the ink cartridge, wherein the test paper is set below the spray points;

Comparing the print image and a preset test image to obtain a similarity between the print image and the preset test image and a blank percentage of the print image relative to the preset test image;

Obtaining a quantity of defective spray points according to the similarity and the blank percentage; and When a ratio of the quantity of defective spray points to the total quantity of spray points is less than or equal to a second preset ratio, determining that the ink cartridge passes verification.

In the present embodiment, it can be investigated whether the control of the spray points is malfunctional by detection of the spray points, but due to disposition of the electrical nozzle and quick-drying ink, the ink cartridge is removed from the printer for a period of time without use, and the quick-drying ink remaining in the nozzle dries, thus causing the ink cartridge nozzle to be clogged. In consideration of the influence of dust in the environment, even if the control of the spray points is normal, the spray points are difficult to spray ink properly. Therefore, the nozzle can be driven to spray ink on the test paper, and the inkjet print on the test paper can be scanned to analyze the similarity between the print image and the preset test image and the blank percentage, determining the quantity of defective spray points. When the quantity of defective spray points is in a range of preset conditions, it indicates that the nozzle of the ink cartridge can spray ink normally.

It should be noted that when the ratio of the quantity of malfunctional spray points to the total quantity of spray points in the ink cartridge is less than or equal to the first preset ratio, and the ratio of the quantity of defective spray points to the total quantity of spray points is less than or equal to the second preset ratio, it can be determined that the ink cartridge passes verification, ensuring the printing effect of the ink cartridge.

Further, when a ratio of the quantity of defective spray points to a quantity of non-malfunctional spray points is less than or equal to a third preset ratio, it can be determined that the ink cartridge passes verification. In the above embodiments, the first preset ratio, the second preset ratio and the third preset ratio are adjustable.

In an embodiment, the step of obtaining a quantity of defective spray points according to the similarity and the blank percentage includes the following steps:

For any of the spray points, when the similarity is less than or equal to a first threshold, or the blank percentage is greater than or equal to a second threshold, determining that the spray point is a defective spray point; and Calculating a quantity of the defective spray points of the ink cartridge.

In the present embodiment, two thresholds can be set for the similarity and the blank percentage, respectively. As long as the similarity is less than or equal to the first threshold, or the blank percentage is greater than or equal to the second threshold, the spray points of the ink cartridge is in a defective state, which cannot print the preset test image properly. The quantity of the defective spray points of the ink cartridge can be calculated comprehensively based on those described above.

It should be noted that the similarity and the blank percentage can be specific to a single spray point, i.e., the similarity and the blank percentage between the inkjet imprint of a single spray point and the image that the single spray point needs to print.

In an embodiment, the step of obtaining a total quantity of spray points of an ink cartridge includes the following steps:

Reading stored information of a control chip of the ink cartridge and obtaining nozzle information of the ink cartridge according to the stored information, wherein the nozzle information includes the total quantity of spray points;

The step of determining that the ink cartridge passes verification further includes the following steps:

Obtaining a quantity of consecutive defective spray points in a single row of the spray points according to the arrangement positions of the defective spray points and the arrangement positions of the spray points; and when the quantity of the consecutive defective spray points is less than or equal to a third threshold, determining that the ink cartridge passes verification.

In the present embodiment, the spray points are arranged in accordance with preset positions, generally divided into several rows of spray points, and each row contains a plurality of spray points. When the inkjet imprints of multiple consecutive spray points in a single row do not meet the requirements for the similarity and the blank percentage, a larger area of blank will appear when printing, seriously affecting the printing effect. Therefore, the quantity of consecutive defective spray points in a single row of the spray points can be determined by the arrangement positions of the defective spray points and the arrangement positions of the spray points. Only when the quantity of consecutive defective spray points in a single row of the spray points is less than or equal to the preset third threshold, the ink cartridge can pass verification and be normally used. The third threshold can be adjusted according to the actual situation.

According to the ink cartridge verification method described above, an ink cartridge verification system is further provided by the present disclosure, and the following is a detailed description of the embodiments of the ink cartridge verification system of the present disclosure.

Figure 3:
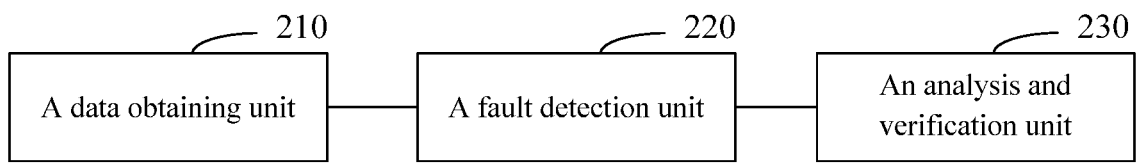
FIG. 3 is a schematic diagram of an ink cartridge verification system according to an embodiment of the present disclosure.

Referring to FIG. 3, a schematic diagram of an ink cartridge verification system according to an embodiment of the present disclosure is shown. The ink cartridge verification system in this embodiment includes:

A data obtaining unit 210, configured to obtain a total quantity of spray points of an ink cartridge;

A fault detection unit 220, configured to detect the spray points of the ink cartridge to obtain a quantity of malfunctional spray points; and An analysis and verification unit 230, configured to determine that the ink cartridge passes verification when a ratio of the quantity of malfunctional spray points to the total quantity of spray points is less than or equal to a first preset ratio.

In the present embodiment, the data obtaining unit 210 can obtain the total quantity of spray points of the ink cartridge, and the fault detection unit 220 can detect the spray points of the ink cartridge to obtain the quantity of malfunctional spray points. The analysis and verification unit 230 can determine that the ink cartridge passes verification when the ratio of the quantity of malfunctional spray points to the total quantity of spray points is less than or equal to the first preset ratio. In the present disclosure, the malfunctional spray points of the ink cartridge are detected to calculate the ratio of the quantity of malfunctional spray points to the total quantity of spray points. When the ratio of the quantity of malfunctional spray points to the total quantity of spray points is small, it can be determined that the ink cartridge passes verification, and it will not have much impact on the printing and the ink cartridge can be used normally As such, the ink cartridge may print effectively after injection of ink and regeneration.

In an embodiment, the data obtaining unit 210 is configured to read stored information of a control chip of the ink cartridge and obtain nozzle information of the ink cartridge according to the stored information, wherein the nozzle information includes the total quantity of spray points.

In an embodiment, for any of the spray points, the fault detection unit 220 is configured to apply a drive signal to the spray point and determine that the spray point is malfunctional when no drive feedback signal is detected.

In an embodiment, the fault detection unit 220 is configured to apply the drive signal to a heating element, wherein the heating element is configured to heat the spray point for spraying ink; and The fault detection unit 220 is further configured to detect a potential at a drive end of the heating element and determine that the spray point is malfunctional when the potential at the drive end is the same as a potential of the drive signal.

In an embodiment, the nozzle information further includes arrangement positions of the spray points, and the analysis and verification unit 230 is configured to obtain a quantity of consecutive malfunctional spray points in a single row of the spray points according to the arrangement positions of the malfunctional spray points and the arrangement positions of the spray points, and determine that the ink cartridge passes verification when the quantity of the consecutive malfunctional spray points is less than or equal to a preset value.

Figure 4:
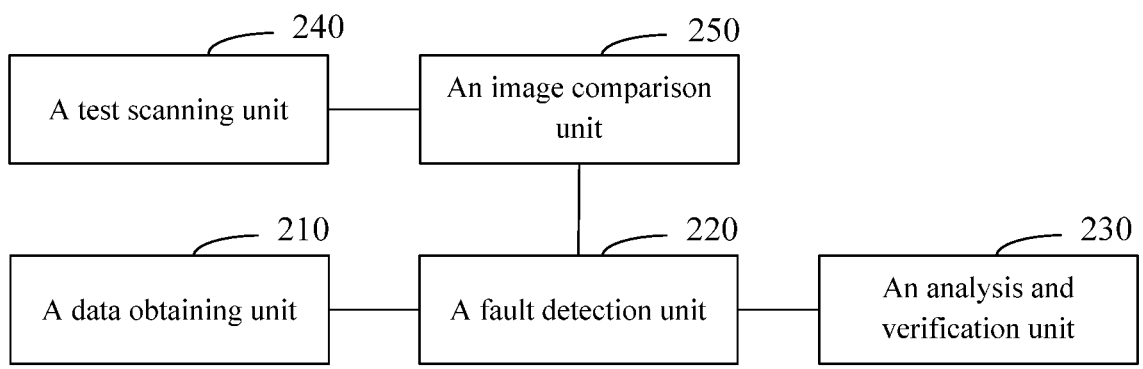
FIG. 4 is a schematic diagram of an ink cartridge verification system according to another embodiment of the present disclosure.

In an embodiment, as shown in FIG. 4, the system further includes a test scanning unit 240 and an image comparison unit 250;

The test scanning unit 240 is configured to scan an inkjet imprint of the spray points on test paper to obtain a print image during a print test of the ink cartridge, wherein the test paper is set below the spray points;

The image comparison unit 250 is configured to compare the print image and a preset test image to obtain a similarity between the print image and the preset test image and a blank percentage of the print image relative to the preset test image;

The fault detection unit 220 is configured to obtain a quantity of defective spray points according to the similarity and the blank percentage; and The analysis and verification unit 230 is configured to determine that the ink cartridge passes verification when a ratio of the quantity of defective spray points to the total quantity of spray points is less than or equal to a second preset ratio.

In an embodiment, for any of the spray points, the fault detection unit 220 is configured to determine that the spray point is a defective spray point when the similarity is less than or equal to a first threshold, or the blank percentage is greater than or equal to a second threshold; and the fault detection unit 220 is further configured to calculate a quantity of the defective spray points of the ink cartridge.

In an embodiment, the first preset ratio and the second preset ratio are adjustable.

In an embodiment, the data obtaining unit 210 is configured to read stored information of a control chip of the ink cartridge and obtain nozzle information of the ink cartridge according to the stored information, wherein the nozzle information includes the total quantity of spray points;

The analysis and verification unit 230 is configured to obtain a quantity of consecutive defective spray points in a single row of the spray points according to the arrangement positions of the defective spray points and the arrangement positions of the spray points, and determine that the ink cartridge passes verification when the quantity of the consecutive defective spray points is less than or equal to a third threshold.

The ink cartridge verification system of the present disclosure corresponds to the ink cartridge verification method of the present disclosure, and the technical features set forth in the above embodiments of the ink cartridge verification method and the beneficial effects thereof are applicable in the embodiments of the ink cartridge verification system.

According to the ink cartridge verification method described above, a readable storage medium and an ink cartridge verification device are further provided by the present disclosure.

A readable storage medium has stored an executable program thereon, wherein the executable program is executed by a processor to implement the ink cartridge verification method as described above.

The readable storage medium, through the stored executable program thereon, can achieve the following advantages: the malfunctional spray points of the ink cartridge are detected to calculate the ratio of the quantity of malfunctional spray points to the total quantity of spray points. When the ratio of the quantity of malfunctional spray points to the total quantity of spray points is small, it can be determined that the ink cartridge passes verification, and it will not have much impact on the printing and the ink cartridge can be used normally. As such, the ink cartridge may print effectively after injection of ink and regeneration.

An ink cartridge verification device includes a memory and a processor, wherein the memory stores an executable program, and the processor is configured to execute the executable program to implement the ink cartridge verification method as described above.

The ink cartridge verification device, by executing the stored executable program thereon, can achieve the following advantages: the malfunctional spray points of the ink cartridge are detected to calculate the ratio of the quantity of malfunctional spray points to the total quantity of spray points. When the ratio of the quantity of malfunctional spray points to the total quantity of spray points is small, it can be determined that the ink cartridge passes verification, and it will not have much impact on the printing and the ink cartridge can be used normally As such, the ink cartridge may print effectively after injection of ink and regeneration.

A person skilled in the art can understand that all or part of the process in the method of the above embodiment can be accomplished by instructing the associated hardware by a computer program, which may be stored in a non-volatile computer readable storage medium, such as in the embodiment, the computer program may be stored in a storage medium of a computer system and executed by at least one processor in the computer system to implement a process of the ink cartridge verification method in the embodiment as described above. The storage medium may be a disk, an optical disk, a read-only memory (ROM), or a random access memory (RAM), etc.

In an embodiment, the ink cartridge verification method can be applied in the ink cartridge tester by the following process:

The ink cartridge tester can be powered up to accommodate AC 110-280V.

A fixing frame for the test paper can be pulled out at the lower end of the ink cartridge tester, and the test paper can be put into a fixing bar. One end of the test paper can be cut flat and inserted into the paper inlet of the paper guide to a proper position (until the test paper cannot be inserted). A button FORWARD on the screen of the ink cartridge tester can be pressed long until the test paper goes out from the paper outlet about 10 cm and the button can be released to complete the test paper mounting.

A fixing bracket for the ink cartridge is selected to mount. After the fixing bracket for the ink cartridge is mounted, the ink cartridge tester will read the information (ID) of the fixing bracket for the ink cartridge, and the reading method includes: there are 4 address lines on a control circuit board (PCB board) of the fixing bracket for the ink cartridge, and these address lines are shorted to ground or overhung to achieve address 0 or 1, which can compose 16 kinds of addresses, such as address 0000 to 1111. A detailed list of ink cartridge models applicable to the fixing bracket for the ink cartridge, displayed on the screen of the ink cartridge tester according to the read ID, can be set up. The user can select the ink cartridge to operate according to the list. In addition, the fixing bracket for the ink cartridge can be serially coded with model number in advance, and the model number of the fixing bracket for the ink cartridge can be displayed on the screen.

A target ink cartridge for testing can be placed, after then the fixing bracket for the ink cartridge can detect the ink cartridge mounting to check if each contact is in good contact, if not, it may be caused by the following problems: a. poor contact, b. ink cartridge failure, c. the ink cartridge and the fixing bracket for the ink cartridge mismatch. Poor contact can be solved by setting a slot in the fixing bracket for the ink cartridge to clamp a matching ink cartridge.

After detection of the ink cartridge mounting is passed, model data of the ink cartridge can be read. The read data can be matched with a model database stored in the ink cartridge tester to find the model number, and after finding the model number to which the ink cartridge belongs, the screen can display the specific model number of the ink cartridge, area of the ink cartridge and detailed graphics of the nozzle of the ink cartridge (including the total quantity of the spray points and the arrangement positions of the spray points).

Each spray point on the ink cartridge has a corresponding thermal resistor, and the corresponding thermal resistor is effective (conducted) when the spray point is selected. The spray point can be detected by taking advantage of this feature. A 10K resistor can be pulled on the drive end of the thermal resistor of the spray point to the power supply VCC. When the thermal resistor of the spray point is selected to conduct, and the thermal resistor of the spray point is connected properly, the potential of the drive side is pulled down. When the thermal resistor is defective, the potential of the drive side will not be pulled down. It can be determined whether the control of the spray point is normal by reading the potential state of the drive end. One spray point can be selected each time to detect the drive end of the thermal resistor, and all spray points are detected in order.

The detection results can be calculated and displayed on the screen, including the total quantity of the spray points, a total tolerant quantity of malfunctional spray points, a maximum tolerant quantity of continuously malfunctional spray points and a schematic diagram of detection results of the spray points (e.g., showing the location of each spray point, the location of the malfunctional spray point, the malfunctional spray point is shown in red, the normal spray point is shown in green). A ratio of the total tolerant quantity of malfunctional spray points to the total quantity of the spray points can be the first preset ratio as described above. The maximum tolerant quantity of continuously malfunctional spray points can be the preset value which is compared with the quantity of the consecutive malfunctional spray points. The first preset ratio and the preset value can be freely adjusted according to actual needs, or the total tolerant quantity of malfunctional spray points can be adjusted.

In order to determine the performance of the ink cartridge more intuitively, the ink cartridge can be used to print test pages, and the corresponding test pages can be printed according to the selected graphics of the test pages. The test page library consists of default test pages cured in the ink cartridge tester and custom test pages. The user can select the default test pages for printing or import an image file of the test page into the memory module of the ink cartridge tester via USB cable from the host computer, and select different test pages for printing from the screen. A spray speed of the spray points of the ink cartridge is matched with a speed of motor-driven paper, and the user can adjust a print speed and the speed of motor-driven paper according to the specific situation.

A sensor module for linear scanning mounted at the paper outlet can capture the image of the print test, and the image can be uploaded to the host computer in real time. The image can also be coded with number consistent with the test ink cartridge number, which is easy to find. At the same time, the captured image and the image of a standard test page are compared to get the similarity and the blank percentage. The defective spray points can be detected through the similarity and the blank percentage, and the detection results will be calculated and displayed on the screen, including the total quantity of the spray points, a total tolerant quantity of defective spray points, a maximum tolerant quantity of continuously defective spray points and a schematic diagram of detection results of the spray points (e.g., showing the location of each spray point, the location of the defective spray point, the defective spray point is shown in red, the normal spray point is shown in yellow). A ratio of the total tolerant quantity of defective spray points to the total quantity of the spray points can be the second preset ratio as described above. The maximum tolerant quantity of continuously defective spray points can be the third threshold which is compared with the quantity of the consecutive defective spray points. The second preset ratio and the third threshold can be freely adjusted according to actual needs, or the total tolerant quantity of defective spray points can be adjusted.

The ink cartridge can be determined to have passed the ink cartridge verification if one or more of the following conditions are met: the quantity of malfunctional spray points is less than or equal to the total tolerant quantity of malfunctional spray points, the quantity of the consecutive malfunctional spray points is less than or equal to the maximum tolerant quantity of continuously malfunctional spray points, the quantity of defective spray points is less than or equal to the total tolerant quantity of defective spray points, and the quantity of continuously defective spray points is less than or equal to the maximum tolerant quantity of continuously defective spray points. The above conditions can be selected according to the actual needs.

The ratio of the quantity of defective spray points to the total quantity of spray points is less than or equal to the second preset ratio, which can be replaced with: the ratio of the quantity of defective spray points to the quantity of non-malfunctional spray points is less than or equal to the third preset ratio, and the third preset ratio can be freely adjusted according to the actual needs.

The threshold of the similarity and the blank percentage of the defective spray points (i.e., the first threshold and the second threshold) can be set through the computer software in the host computer, and the image of the test can be categorized and saved in the form of a document to facilitate subsequent record finding. The selection of the standard test page is synchronized by the serial port connected to the host computer and the device, i.e., the test page can be selected on the host computer and the selected test page data can be transferred to the device through the serial port, or the test page can be selected on the device and the selected test page data can be uploaded to the host computer by the serial port. In addition, the data related to the states of the spray points in the test results can be uploaded to the host computer.

The technical features of the above-described embodiments may be combined in any combination. For the sake of brevity of description, all possible combinations of the technical features in the above embodiments are not described. However, as long as there is no contradiction between the combinations of these technical features, all should be considered as within the scope of this disclosure.

A person skilled in the art can understand that all or part of the process in the method of the above embodiment can be accomplished by instructing the associated hardware by a program, which may be stored in a readable storage medium of a computer. The program includes the steps described in the method above when executed. The storage medium includes a ROM/RAM, a disk, or an optical disk, etc.

The above-described embodiments are merely illustrative of several embodiments of the present disclosure, and the description thereof is relatively specific and detailed, but is not to be construed as limiting the scope of the disclosure. It should be noted that a plurality of variations and modifications may be made by those skilled in the art without departing from the spirit and scope of the disclosure. Therefore, the scope of the disclosure should be determined by the appended claims.

The above-described embodiments are merely illustrative of several embodiments of the present disclosure, and the description thereof is relatively specific and detailed, but is not to be construed as limiting the scope of the disclosure. It should be noted that a plurality of variations and modifications may be made by those skilled in the art without departing from the spirit and scope of the disclosure. Therefore, the scope of the disclosure should be determined by the appended claims.

We claim:

1. An ink cartridge verification method wherein the method comprises the following steps:
    obtaining a total quantity of spray points of an ink cartridge;
    detecting the spray points of the ink cartridge to obtain a quantity of malfunctional spray points; and
    when a ratio of the quantity of malfunctional spray points to the total quantity of spray points is less than or equal to a first preset ratio, determining that the ink cartridge passes verification;
    the step of detecting the spray points of the ink cartridge comprises the following steps:
        for any of the spray points, applying a drive signal to the spray point, and when no drive feedback signal is detected, determining that the spray point is malfunctional;
    the step of applying a drive signal to the spray point, and the determining that the spray point is malfunctional comprises the following steps:

applying the drive signal to a heating element, wherein the heating element is configured to heat the spray point for spraying ink; and detecting a potential at a drive end of the heating element, and when the potential at the drive end is the same as a potential of the drive signal, determining that the spray point is malfunctional.

2. The method of claim 1, wherein the step of obtaining a total quantity of spray points of an ink cartridge comprises the following steps:

reading stored information of a control chip of the ink cartridge and obtaining nozzle information of the ink cartridge according to the stored information, wherein the nozzle information comprises the total quantity of spray points.

3. The method of claim 2, wherein the nozzle information further comprises arrangement positions of the spray points, the step of determining that the ink cartridge passes verification further comprising the following steps:

obtaining a quantity of consecutive malfunctional spray points in a single row of the spray points according to the arrangement positions of the malfunctional spray points and the arrangement positions of the spray points; and when the quantity of the consecutive malfunctional spray points is less than or equal to a preset value, determining that the ink cartridge passes verification.

4. The method of claim 1, wherein the step of determining that the ink cartridge passes verification comprises the following steps:

scanning an inkjet imprint of the spray points on test paper to obtain a print image during a print test of the ink cartridge, wherein the test paper is set below the spray points;

comparing the print image and a preset test image to obtain a similarity between the print image and the preset test image and a blank percentage of the print image relative to the preset test image;

obtaining a quantity of defective spray points according to the similarity and the blank percentage; and when a ratio of the quantity of defective spray points to the total quantity of spray points is less than or equal to a second preset ratio, determining that the ink cartridge passes verification.

5. The method of claim 4, wherein the step of obtaining a quantity of defective spray points according to the similarity and the blank percentage comprises the following steps:

for any of the spray points, when the similarity is less than or equal to a first threshold, or the blank percentage is greater than or equal to a second threshold, determining that the spray point is a defective spray point; and calculating a quantity of the defective spray points of the ink cartridge.

6. The method of claim 4, wherein the first preset ratio and the second preset ratio are adjustable.

7. An ink cartridge verification system, comprising:

a data obtaining unit, configured to obtain a total quantity of spray points of an ink cartridge;

a fault detection unit, configured to detect the spray points of the ink cartridge to obtain a quantity of malfunctional spray points; and an analysis and verification unit, configured to determine that the ink cartridge passes verification when a ratio of the quantity of malfunctional spray points to the total quantity of spray points is less than or equal to a first preset ratio;

for any of the spray points, the fault detection unit is configured to apply a drive signal to the spray point and determine that the spray point is malfunctional when no drive feedback signal is detected;

the fault detection unit is further configured to apply the drive signal to a heating element, wherein the heating element is configured to heat the spray point for spraying ink; and the fault detection unit is further configured to detect a potential at a drive end of the heating element and determine that the spray point is malfunctional when the potential at the drive end is the same as a potential of the drive signal.

8. An ink cartridge verification device, comprising a memory and a processor, wherein the memory stores an executable program, and the processor is configured to execute the executable program to implement an ink cartridge verification method comprising:

obtaining a total quantity of spray points of an ink cartridge;

detecting the spray points of the ink cartridge to obtain a quantity of malfunctional spray points; and when a ratio of the quantity of malfunctional spray points to the total quantity of spray points is less than or equal to a first preset ratio, determining that the ink cartridge passes verification;

the step of detecting the spray points of the ink cartridge comprises the following steps:

for any of the spray points, applying a drive signal to the spray point, and when no drive feedback signal is detected, determining that the spray point is malfunctional;

the step of applying a drive signal to the spray point, and the determining that the spray point is malfunctional comprises the following steps:

applying the drive signal to a heating element, wherein the heating element is configured to heat the spray point for spraying ink; and detecting a potential at a drive end of the heating element, and when the potential at the drive end is the same as a potential of the drive signal, determining that the spray point is malfunctional.

* * * * *